(12) United States Patent
Abe et al.

(10) Patent No.: US 11,735,687 B2
(45) Date of Patent: Aug. 22, 2023

(54) METHOD OF MANUFACTURING LIGHT EMITTING DEVICE HAVING A LIGHT-SHIELDING FRAME AROUND A LIGHT EMITTING SURFACE

(71) Applicant: NICHIA CORPORATION, Anan (JP)

(72) Inventors: Shogo Abe, Tokushima (JP); Yuki Ogura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 212 days.

(21) Appl. No.: 17/179,320

(22) Filed: Feb. 18, 2021

(65) Prior Publication Data
US 2021/0280737 A1 Sep. 9, 2021

(30) Foreign Application Priority Data

Mar. 9, 2020 (JP) ................. 2020-040242

(51) Int. Cl.
*H01L 33/00* (2010.01)
*H01L 33/58* (2010.01)
(Continued)

(52) U.S. Cl.
CPC .......... *H01L 33/0095* (2013.01); *H01L 33/54* (2013.01); *H01L 33/56* (2013.01); *H01L 33/58* (2013.01); *H01L 33/62* (2013.01); *H01L 2933/005* (2013.01); *H01L 2933/0058* (2013.01); *H01L 2933/0066* (2013.01)

(58) Field of Classification Search
CPC ..... H01L 33/50–508; H01L 2933/0041; H01L 33/52–56; H01L 2933/005
See application file for complete search history.

(56) References Cited

U.S. PATENT DOCUMENTS

2009/0166657 A1 7/2009 Yamada et al.
2015/0262987 A1* 9/2015 Wada .................... H01L 29/866
438/27
(Continued)

FOREIGN PATENT DOCUMENTS

JP H09232347 A 9/1997
JP 2001176896 A 6/2001
(Continued)

*Primary Examiner* — Jay C Chang
*Assistant Examiner* — Mikka Liu
(74) *Attorney, Agent, or Firm* — Global IP Counselors, LLP

(57) ABSTRACT

A method of manufacturing a light emitting device includes: providing a first intermediate body including a substrate, first bonding members, a second bonding member, a light emitting element, a protecting element, a light transmissive member bonded to the light emitting element, and a light-shielding frame surrounding the light transmissive member in a top view, a portion of an outer periphery of the light-shielding frame being located above the protecting element such that at least a portion of the protecting element is exposed from the light-shielding frame in the top view; disposing a first resin between the light emitting element and the substrate by applying the first resin on the substrate in a region outside of the portion of the protecting element such that the first resin moves toward the light emitting element along the protecting element; and curing the first resin to obtain a first cover member.

10 Claims, 16 Drawing Sheets

(51) Int. Cl.
  *H01L 33/56* (2010.01)
  *H01L 33/54* (2010.01)
  *H01L 33/62* (2010.01)

(56) References Cited

U.S. PATENT DOCUMENTS

2017/0154880 A1* 6/2017 Ozeki .................... H01L 33/58
2018/0033926 A1   2/2018 Nonogawa
2019/0165218 A1   5/2019 Nakai et al.
2019/0302350 A1  10/2019 Yamaoka et al.

FOREIGN PATENT DOCUMENTS

| JP | 2003007737 A | 1/2003 |
| JP | 2009182307 A | 8/2009 |
| JP | 2015188053 A | 10/2015 |
| JP | 2018019032 A | 2/2018 |
| JP | 2019102614 A | 6/2019 |
| JP | 2019186513 A | 10/2019 |

* cited by examiner

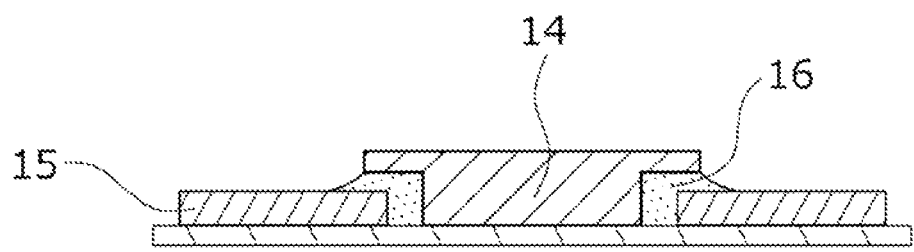
FIG. 3I
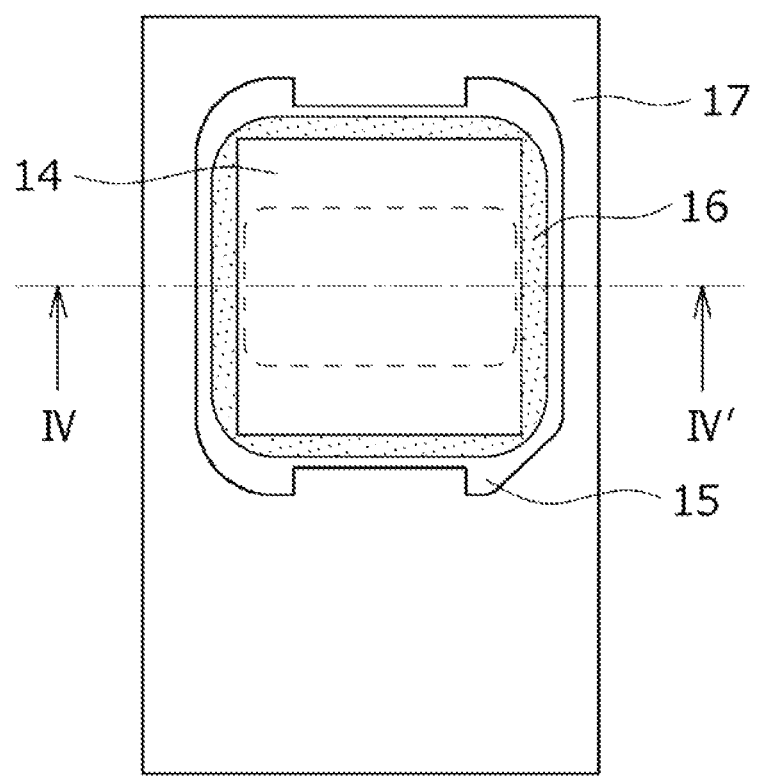

METHOD OF MANUFACTURING LIGHT EMITTING DEVICE HAVING A LIGHT-SHIELDING FRAME AROUND A LIGHT EMITTING SURFACE

CROSS-REFERENCE TO RELATED APPLICATIONS

This application claims priority to Japanese Patent Application No. 2020-040242 filed on Mar. 9, 2020. The entire disclosure of Japanese Patent Application No. 2020-040242 is hereby incorporated herein by reference.

BACKGROUND

Technical Field

The present disclosure relates to a method of manufacturing a light emitting device and a method of inspecting a light emitting device.

Background Art

To increase the difference in luminance between the inside and the outside of the light emission surface, a light emitting device including a light shielding frame disposed around the light emitting surface has been proposed (for example, see JP 2019-186513 A).

SUMMARY

One object of the present disclosure is to provide a method of manufacturing a light emitting device including a light-shielding frame in which a resin member surrounding a light emitting element can be disposed in place and a method of inspecting a light emitting device that allows for facilitating confirming that the resin member is disposed in place.

(1) A method of manufacturing a light emitting device according to one embodiment of the present invention providing a first intermediate body including a substrate, a plurality of first bonding members, a second bonding member, a light emitting element mounted on an upper surface of the substrate via the plurality of first bonding members, a protecting element mounted on the upper surface of the substrate via the second bonding member and spaced apart from the light emitting element, a light transmissive member bonded to an upper surface of the light emitting element, and a light-shielding frame surrounding the light transmissive member in a top view, a portion of an outer periphery of the light-shielding frame being located above the protecting element such that at least a portion of the protecting element is exposed from the light-shielding frame in the top view; disposing a first resin between the light emitting element and the substrate by applying the first resin on the substrate in a region outside of the portion of the protecting element exposed from the light-shielding frame in the top view such that the first resin moves toward the light emitting element along the protecting element; and curing the first resin to obtain a first cover member.

(2) A method of inspecting a light emitting device according to another embodiment of the present invention includes: providing a first intermediate body including a substrate, a plurality of first bonding members, a second bonding member, a light emitting element mounted on an upper surface of the substrate via the plurality of first bonding members, a protecting element mounted on the upper surface of the substrate via the second bonding member and spaced apart from the light emitting element, a light transmissive member bonded to an upper surface of the light emitting element, and a light-shielding frame surrounding the light transmissive member in a top view, a portion of an outer periphery of the light-shielding frame being located above the protecting element such that at least a portion of the protecting element is exposed from the light-shielding frame in the top view; disposing a first resin between the light emitting element and the substrate by applying the first resin on the substrate in a region outside of the portion of the protecting element exposed from the light-shielding frame in the top view such that the first resin moves toward the light emitting element along the protecting element; defining an inspection region on the substrate in the region outside of the portion of the protecting element exposed from the light-shielding frame in the top view; and after the disposing of the first resin, inspecting whether the first resin is disposed between the light emitting device and the substrate by detecting a shape of the first resin covering the inspection region.

According to the method of manufacturing a light emitting device according to one embodiment of the present invention, in a light emitting device including a light-shielding frame, the resin member surrounding the light emitting element can be easily and reliably disposed in place. According to the method of inspecting a light emitting device according to one embodiment of the present invention, the disposition of the resin member in place can be easily confirmed.

BRIEF DESCRIPTION OF DRAWINGS

FIG. 3H is a schematic cross-sectional view (cross-sectional view taken along line IV-IV' of FIG. 3I) illustrating the step of forming the first intermediate body in the method of manufacturing a light emitting device according to one embodiment of the present invention.

FIG. 3I is a schematic plan view illustrating the step of forming the first intermediate body in the method of manufacturing a light emitting device according to one embodiment of the present invention.

DETAILED DESCRIPTION

Figure 1A:
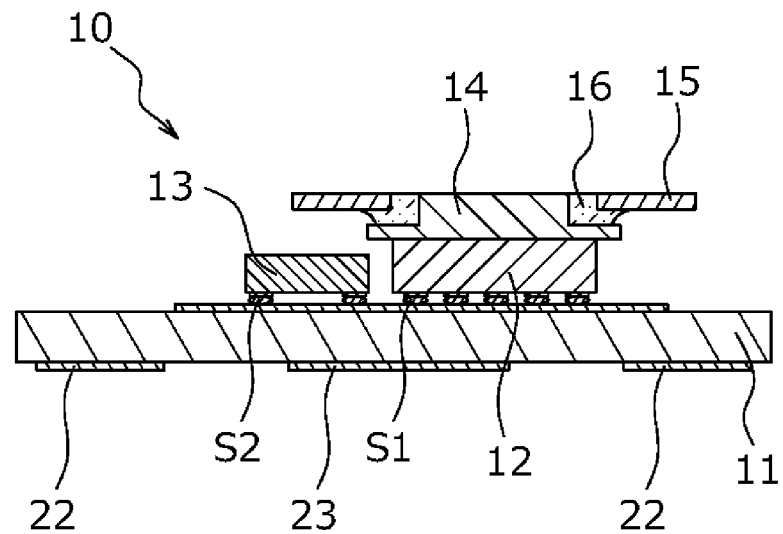
FIG. 1A is a schematic cross-sectional view (cross-sectional view taken along line I-I' of FIG. 1B) illustrating a method of manufacturing a light emitting device according to one embodiment of the present invention.

Certain embodiments of the present invention will be described below with reference to the drawings as appropriate. However, the embodiments described below are intended to embody the technical idea of the present invention, and the present invention is not limited to the description below unless otherwise specified. The size, positional relationship, or the like of members illustrated in the drawings may be exaggerated for clarity of description. For a cross-sectional view, a cross-sectional end view illustrating only a cutting surface may be used. Members denoted by the same designations in a plurality of embodiments represent the same or corresponding members. For such members in each embodiment, materials, sizes, and the like of the same or corresponding members described in other embodiments can be employed unless otherwise specified.

First Embodiment: Method of Manufacturing Light Emitting Device 100

A method of manufacturing a light emitting device according to the first embodiment includes: providing a first intermediate body including a substrate, a plurality of first bonding members, a second bonding member, a light emitting element mounted on an upper surface of the substrate via the plurality of first bonding members, a protecting element mounted on the upper surface of the substrate via the second bonding member and spaced apart from the light emitting element, a light transmissive member bonded to an upper surface of the light emitting element, and a light-shielding frame surrounding the light transmissive member in a top view, a portion of an outer periphery of the light-shielding frame being located above the protecting element such that at least a portion of the protecting element is exposed from the light-shielding frame in the top view; disposing a first resin between the light emitting element and the substrate by applying the first resin on the substrate in a region outside of the portion of the protecting element exposed from the light-shielding frame in the top view such that the first resin moves toward the light emitting element along the protecting element; and curing the first resin to obtain a first cover member. The manufacturing method can further include, after the forming of the first cover member, forming a second cover member on the substrate that covers the first cover member and the lateral surface of the light-shielding frame. According to such a method of manufacturing a light emitting device, in a high-power light emitting device using a light emitting element to be used for a light source for on-vehicle applications or the like, the resin member surrounding the light emitting element can be easily and reliably disposed in place even after the light-shielding frame is disposed around the light emitting surface such that the luminance difference between the inside and the outside of the light emission surface is increased to more efficiently extract light emitted by the light emitting element.

Light Emitting Device 100

Figure 1B:
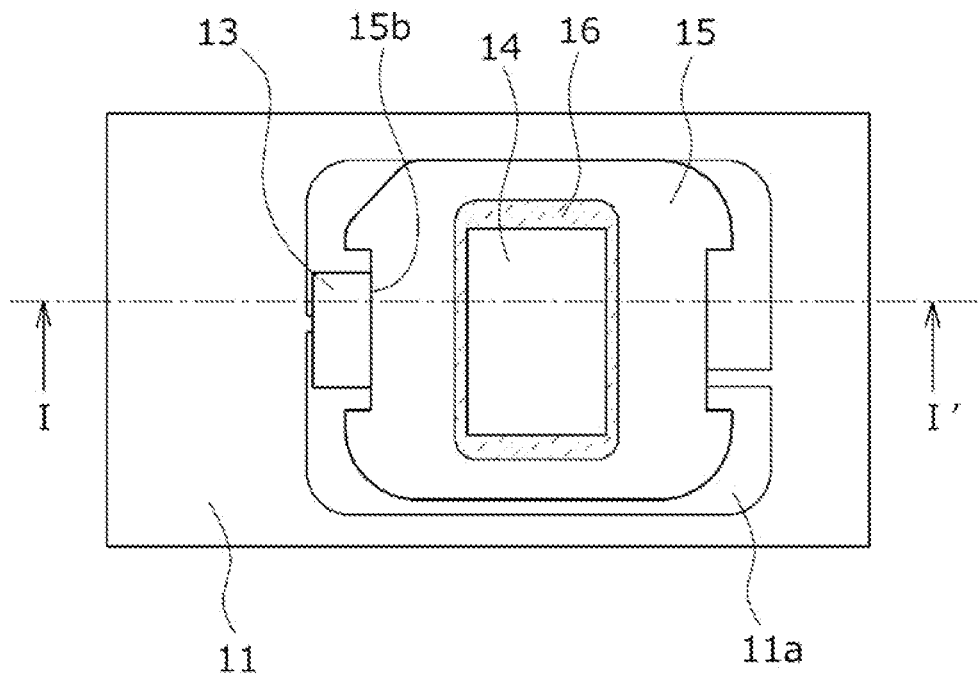
FIG. 1B is a schematic plan view of FIG. 1A.
Figure 1C:
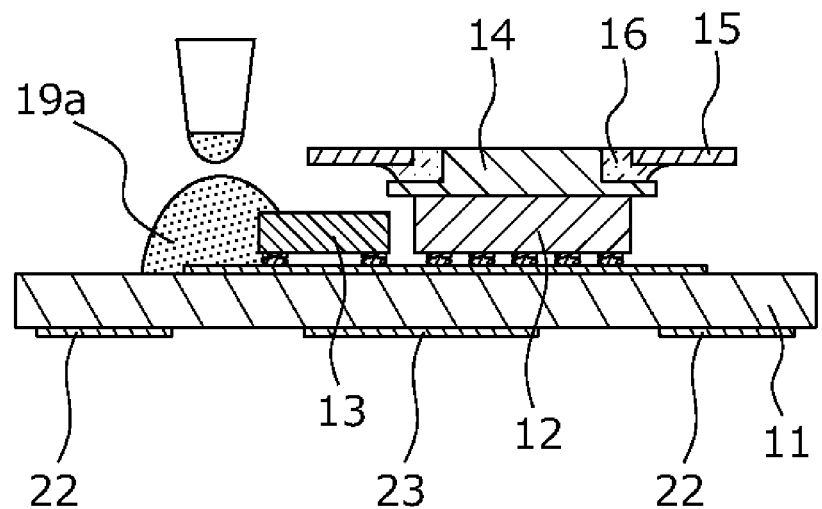
FIG. 1C is a schematic cross-sectional view illustrating the method of manufacturing a light emitting device according to one embodiment of the present invention.
Figure 1D:
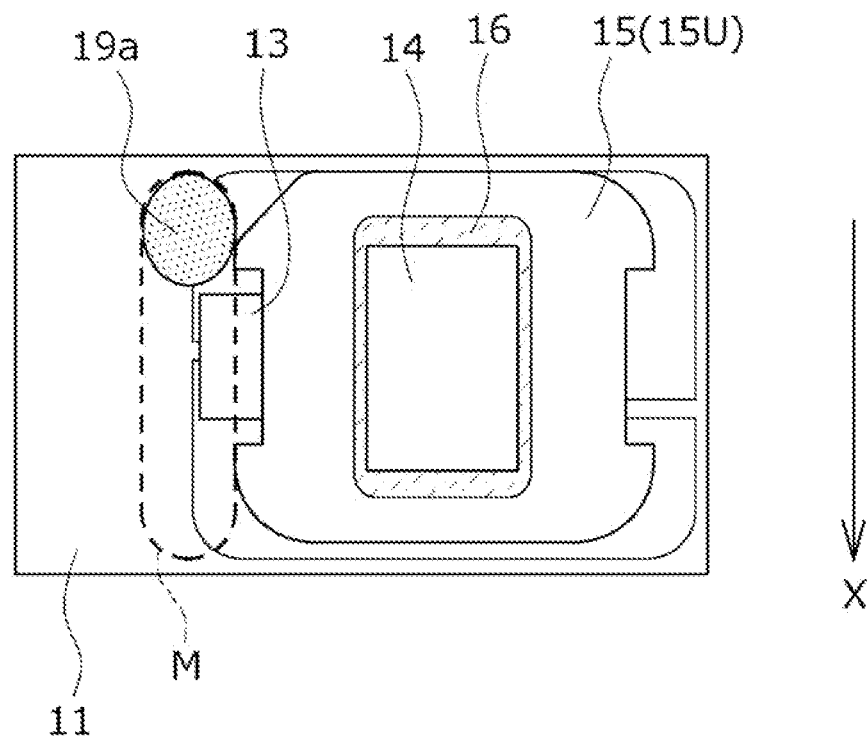
FIG. 1D is a schematic plan view of FIG. 1C.
Figure 1E:
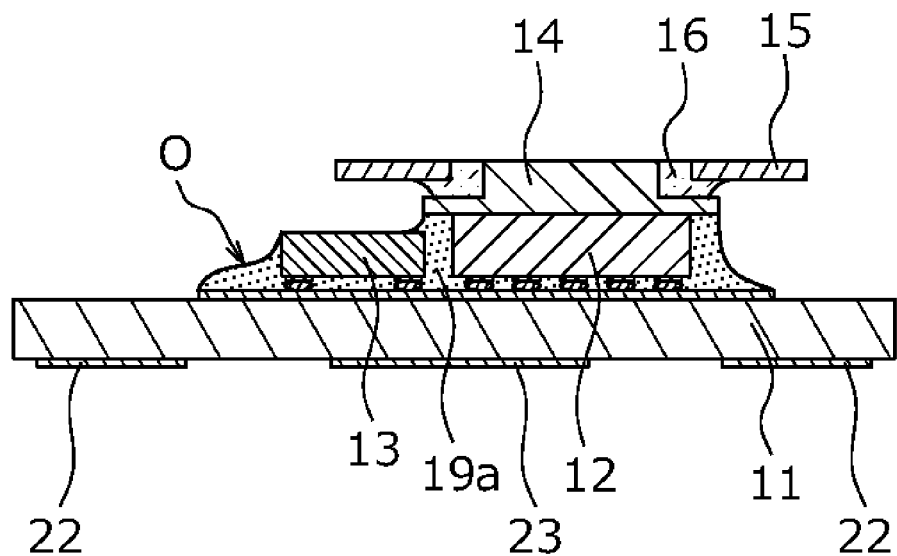
FIG. 1E is a schematic cross-sectional view (cross-sectional view taken along line II-II' of FIG. 1F) illustrating the method of manufacturing a light emitting device according to one embodiment of the present invention.
Figure 1F:
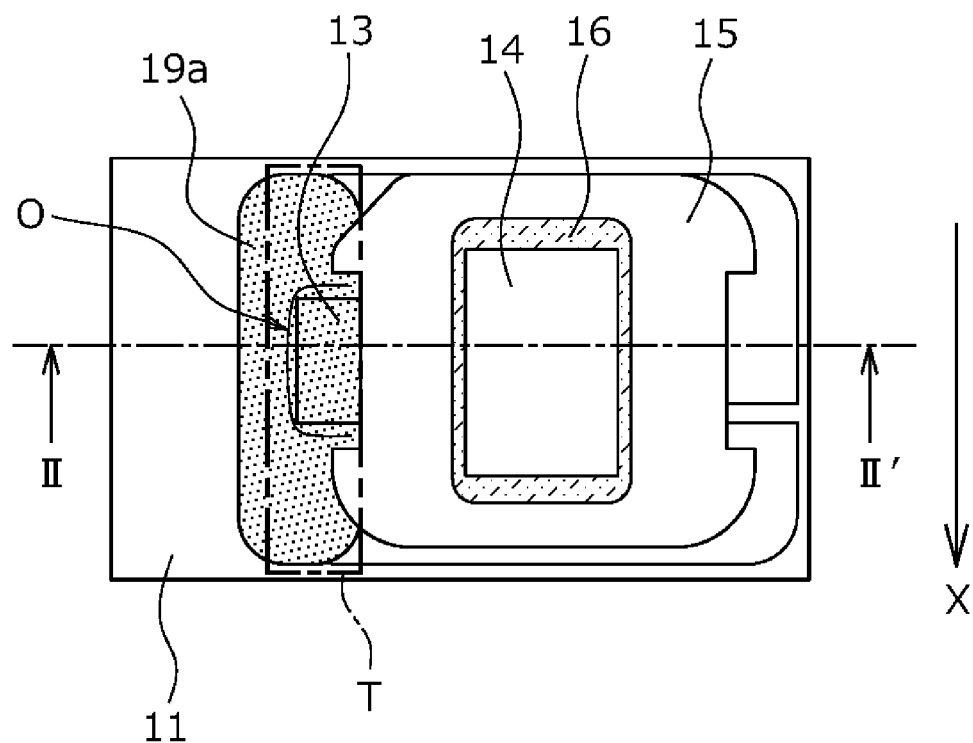
FIG. 1F is a schematic plan view of FIG. 1E.
Figure 1G:
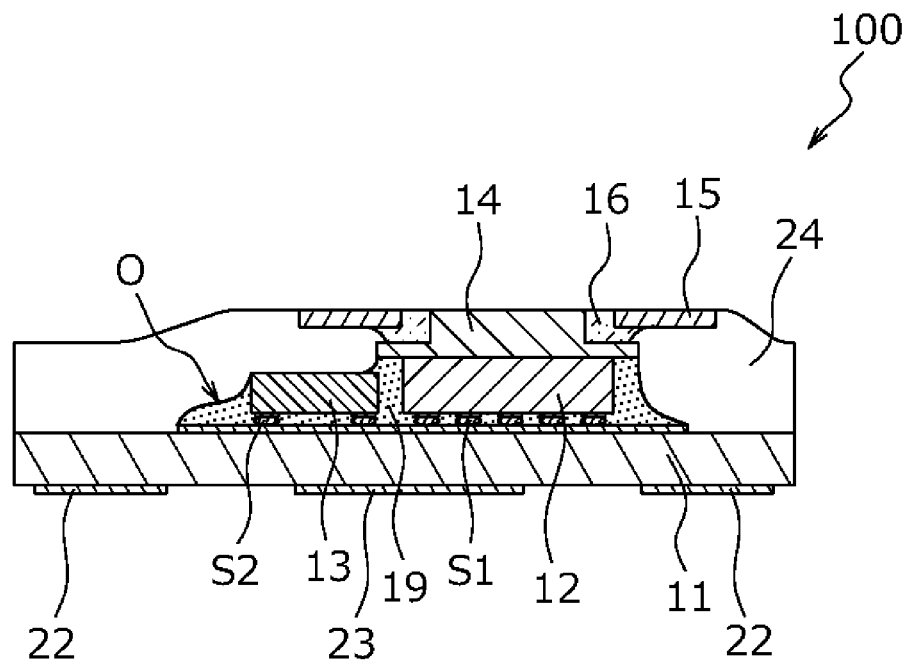
FIG. 1G is a schematic cross-sectional view illustrating a light emitting device obtained through the method of manufacturing a light emitting device according to one embodiment of the present invention.
Figure 1H:
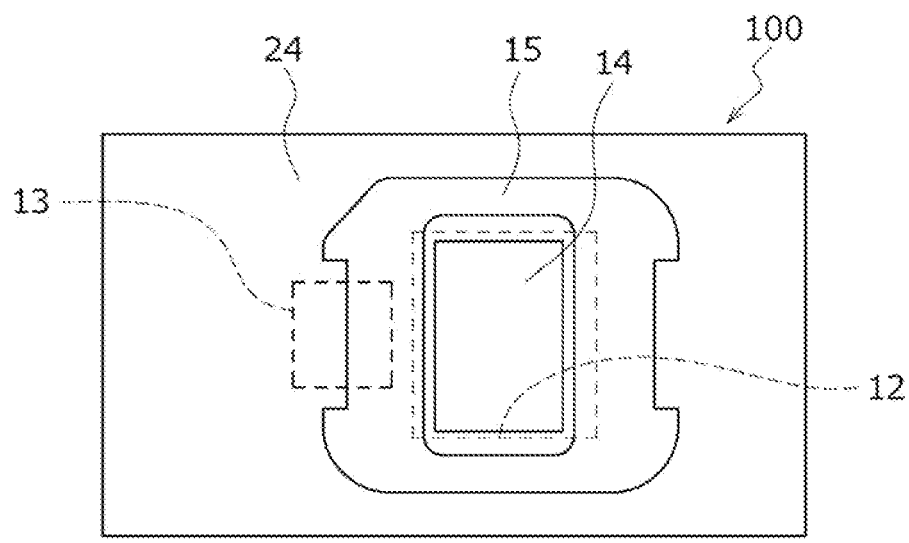
FIG. 1H is a schematic plan view of the light emitting device of FIG. 1G.
Figure 1I:
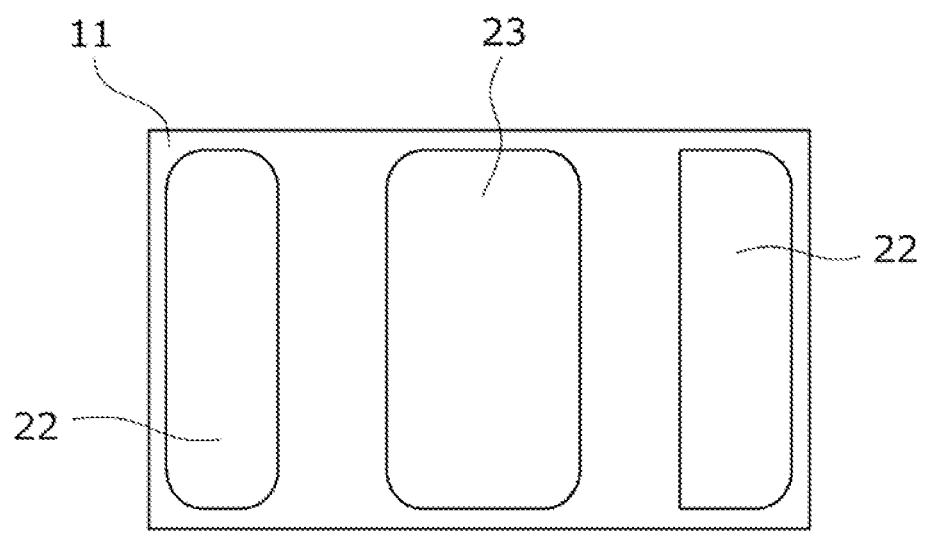
FIG. 1I is a schematic bottom view of the light emitting device of FIG. 1G.

As illustrated in FIGS. 1G to 1I, for example, a light emitting device 100 obtained through the manufacturing method according to the present embodiment includes a substrate 11, a light emitting element 12 mounted on an upper surface of the substrate 11 via a plurality of first bonding members S1, a protecting element 13 mounted on the upper surface of the substrate 11 via a second bonding member S2 and spaced apart from the light emitting element 12, a light transmissive member 14 bonded to the upper surface of the light emitting element, a light-shielding frame 15 surrounding the light transmissive member 14 in a top view and having an outer periphery including a portion located above the protecting element 13 such that at least a portion of the protecting element 13 is exposed from the light-shielding frame 15 in the top view, and a first cover member 19 disposed between the light emitting element 12 and the substrate 11. Furthermore, the light emitting device 100 preferably includes a second cover member 24 covering the first cover member and lateral surfaces of the light-shielding frame on the substrate. Positive and negative electrodes 22 for external connection are disposed on a lower surface of the light emitting device 100. Furthermore, a heat dissipation terminal 23 that is electrically separated from the light emitting element 12 can be disposed on the lower surface of the light emitting device 100. The positive and negative electrodes can be disposed, for example facing each other with the heat dissipation terminal 23 disposed between the positive and negative electrodes. The heat dissipation terminal 23 and the light emitting element 12 can be electrically connected via the positive electrode 22 or the negative electrode 22.

Providing First Intermediate Body 10

A first intermediate body 10 includes, for example, the substrate 11, the light emitting element 12, the protecting element 13, the light transmissive member 14, and the light-shielding frame 15, as illustrated in FIGS. 1A and 1B. The first intermediate body 10 preferably further includes a third cover member 16 for securing the light transmissive member 14 and the light-shielding frame 15. A step of providing the first intermediate body 10 includes providing a first intermediate body that includes the substrate 11, the light emitting element 12 mounted on the upper surface of the substrate 11 via the plurality of first bonding members S1, the protecting element 13 mounted on the upper surface of the substrate 11 via the second bonding member S2 and separated from the light emitting element 12, the light transmissive member 14 bonded to the upper surface of the light emitting element 12, and the light-shielding frame 15 surrounding the light transmissive member 14 in a top view and including an outer edge including a portion located above the protecting element 13 such that at least a portion of the protecting element 13 is exposed from the light-shielding frame 15 in the top view. The step of providing the first intermediate body 10 can further include providing a second intermediate body 20 (see FIG. 3J) including the light transmissive member 14 (see FIG. 3E) including a first surface 14U, a second surface 14B opposite the first surface 14U, and a lateral surface 14S between the first surface 14U and the second surface 14B, the light-shielding frame 15 defining an opening 15a (see FIG. 3B), and a third cover member 16 bonding an inner surface of the light-shielding frame 15 that defines the opening 15a and the lateral surface 14S of the light transmissive member 14. It is preferable that members such as the substrate 11, the light emitting element 12, the protecting element 13, the light transmissive member 14, and the light-shielding frame 15 that are included in the first intermediate body 10 are provided before the step of providing the first intermediate body 10.

Substrate 11

Figure 2A:
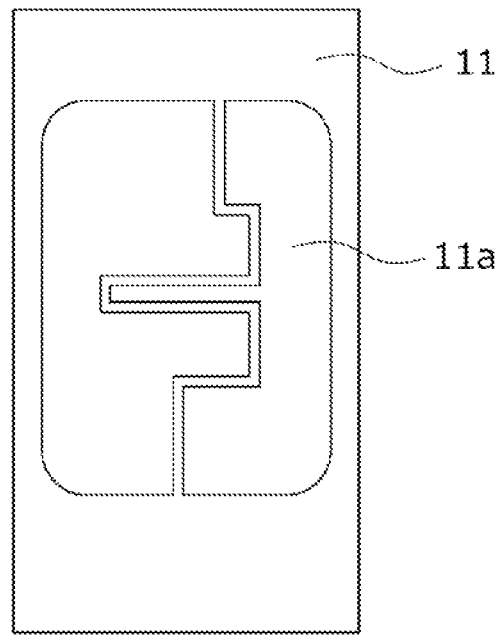
FIG. 2A is a schematic plan view illustrating a substrate used in the method of manufacturing a light emitting device according to one embodiment of the present invention.

The substrate 11 is a member that supports the light emitting element 12 and the like. As illustrated in FIG. 2A, for example, the substrate 11 at least includes two or more wirings 11a that are electrically connected to the electrode of the light emitting element 12 and disposed on a surface of the substrate 11. For a main material of the substrate 11, an insulating material in which light from the light emitting element 12 and light from outside are less likely to be transmitted is preferably used. Examples of such materials include ceramics such as alumina and aluminum nitride, and resins such as phenol resins, epoxy resins, silicone resins, polyimide resins, BT resins, and polyphthalamide. In a case in which a resin is used, inorganic fillers such as glass fibers, silicon oxide, titanium oxide, and alumina, can be mixed with the resin when necessary. This allows for improving the mechanical strength, reducing the thermal expansion coefficient, and increasing the light reflectance. The substrate 11 can include the wirings 11a disposed on a surface of the metal member with an insulating material between the surface of the metal member and the wirings. The wirings 11a are formed in a predetermined pattern on the insulating material. Examples of a material used for the wirings include metals such as gold, silver, copper, iron, titanium, palladium, nickel, chromium, platinum, tungsten, and aluminum or alloys including two or more of these. The wirings can be formed by electrolytic plating, non-electrolytic plating, vapor deposition, sputtering, or the like. For example, in a case in which gold is used for a material of the first bonding member S1 described below, using gold for an outermost surface of the wirings 11a allows for improving the bonding between the light emitting element 12 and the substrate 11.

Light Emitting Element 12

Figure 2B:
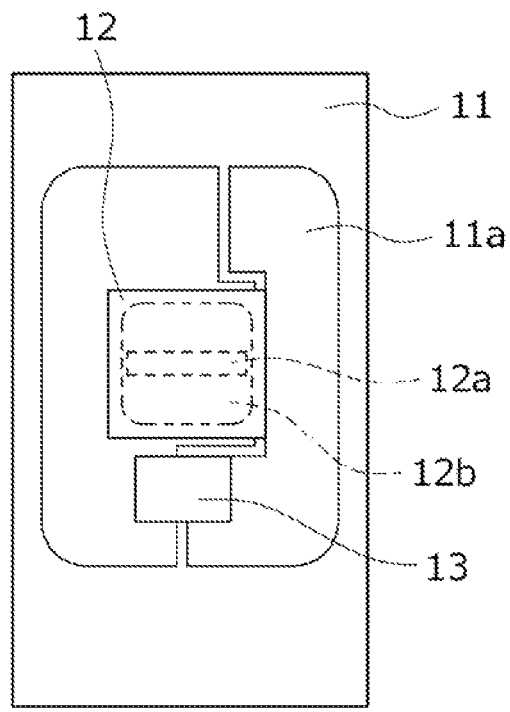
FIG. 2B is a schematic plan view illustrating a state in which a light emitting element and a protecting element are mounted on a substrate used in the method of manufacturing a light emitting device according to an embodiment of the present invention.

A light emitting diode is preferably used for the light emitting element 12. A light emitting element having any appropriate wavelength can be selected for the light emitting element 12. For example, examples of blue or green light emitting elements include those using a nitride semiconductor (InXAlYGal-X—YN, 0≤X, 0≤Y, X+Y≤1), ZnSe, and GaP. Examples of a red light emitting element include GaAlAs, AlInGaP, and the like. Furthermore, a semiconductor light emitting element made of other materials can be used. The light emission color, size, number, and the like of the light emitting elements used can be selected appropriately according to the purpose. When a light emitting device including a phosphor is to be obtained, a nitride semiconductor described above configured to emit light with a short wavelength that can efficiently excite the phosphor is preferable. The light emitting element 12 is formed, for example, by layering a nitride semiconductor layer on a light transmissive support substrate, and a surface of the light emitting element located closer to the support substrate serves as a main light extraction surface of the light emitting element 12. The support substrate can be removed by, for example, polishing, laser lift-off, or the like. The light emitting element 12 preferably includes, for example, a first electrode 12a and a second electrode 12b on the same surface side, that is, surfaces at an opposite side to the light emission surface. The first electrode 12a and the second electrode 12b are disposed in the light emitting element 12 such that, for example, as illustrated in FIG. 2B, the first electrode 12a is disposed in a central portion, and the second electrode 12b is disposed around the first electrode 12a in a plan view.

The light emitting element 12 is mounted on the substrate 11 such that a surface of the light emitting element 12 on which the electrode is disposed serves as a lower surface and faces the substrate 11, with a plurality of first bonding members disposed between the substrate 11 and the light emitting element 12. More specifically, the first electrode 12a and the second electrode 12b of the light emitting element 12 are connected to the first or second wiring provided on the substrate 11 via respective first bonding members S1. Examples of the first bonding member S1 include, bumps made of Au, Ag, Cu, or alloys including two or more of these, solders such as tin-bismuth based solders, tin-copper based solders, tin-silver based solders, or gold-tin based solders, eutectic alloys of alloys having Au and Sn as a main component, alloys having Au and S1 as a main component, alloys having Au and Ge as a main component or the like, conductive pastes made of Au, Ag, or Pd, anisotropic conductive materials such as ACP and ACF, brazing materials made of low melting point metals, and conductive adhesives and conductive composite adhesives using a combination of two or more of these. Of these, bumps are preferably used in view of positional accuracy. In view of heat dissipation, it is preferable that the first electrode 12a and the second electrode 12b are connected onto the substrate 11 via respective ones of a plurality of bumps. The light emitting element 12 is connected onto the substrate 11 using the first bonding members S1, which allows for increasing the contact area with the substrate and decreasing the connection resistance compared to a light emitting element connected by a metal wire or the like. For example, in a case in which the light emitting element 12 is bonded to the wiring by the first bonding members S1 such as bumps, a gap corresponding to a thickness of the first bonding member S1 is created between the light emitting element and the substrate 11 and between the plurality of first bonding members S1. A first cover member having light reflection properties is disposed in the gap, which allows light from the light emitting element to be reflected toward the substrate 11, so that the light can be efficiently externally extracted. In FIGS. 1A to 1F, a single light emitting element 12 is provided for a single first intermediate body 10, as illustrated in FIG. 2A. In a plan view, the light emitting element 12 has, for example, a rectangular shape. The light emitting element 12 can be provided through some or all of the manufacturing steps, such as through a step of semiconductor growth, or can be provided by purchasing.

Protecting Element 13

The protecting element 13 is separated from the light emitting element 12 and is mounted on the upper surface of the substrate 11 with a second bonding member S2 disposed between the upper surface of the substrate 11 and the light emitting element 12. Examples of the protecting element 13 include capacitors, varistors, Zener diodes, and bridge diodes. As illustrated in FIGS. 1A, 1G, etc., for example, the protecting element 13 is preferably disposed such that the lateral surface of the protecting element 13 faces the lateral surface of the light emitting element 12. With this arrangement, the protecting element 13 can be disposed closer to the light emitting element 12. Furthermore, a first resin, which will be described below, can be easily moved toward the light emitting element along the protecting element and through a gap between the opposing lateral surfaces. In a plan view, the protecting element 13 has, for example, a rectangular shape.

Light Transmissive Member 14

Figure 3A:
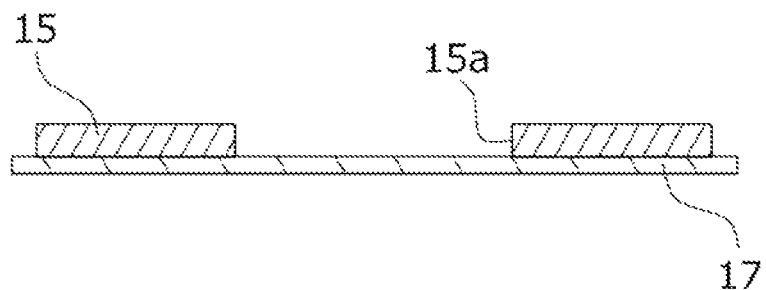
FIG. 3A is a schematic cross-sectional view (cross-sectional view taken along line of FIG. 3B) illustrating a step of forming a first intermediate body in the method of manufacturing a light emitting device according to one embodiment of the present invention.
Figure 3B:
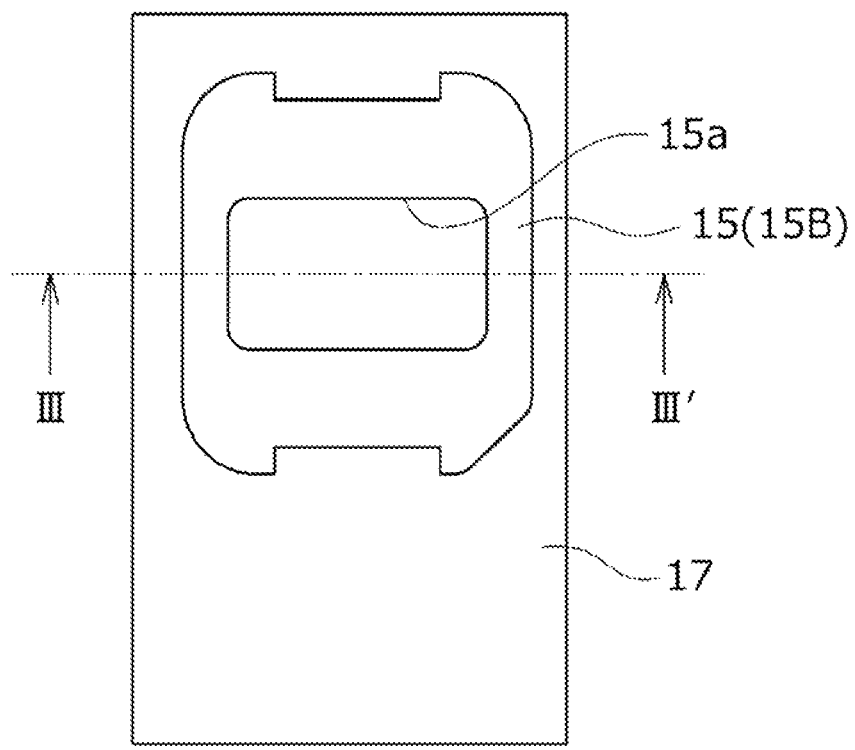
FIG. 3B is a schematic plan view of FIG. 3A.
Figure 3C:
FIG. 3C is a schematic cross-sectional view illustrating the step of forming the first intermediate body in the method of manufacturing a light emitting device according to one embodiment of the present invention.
Figure 3D:
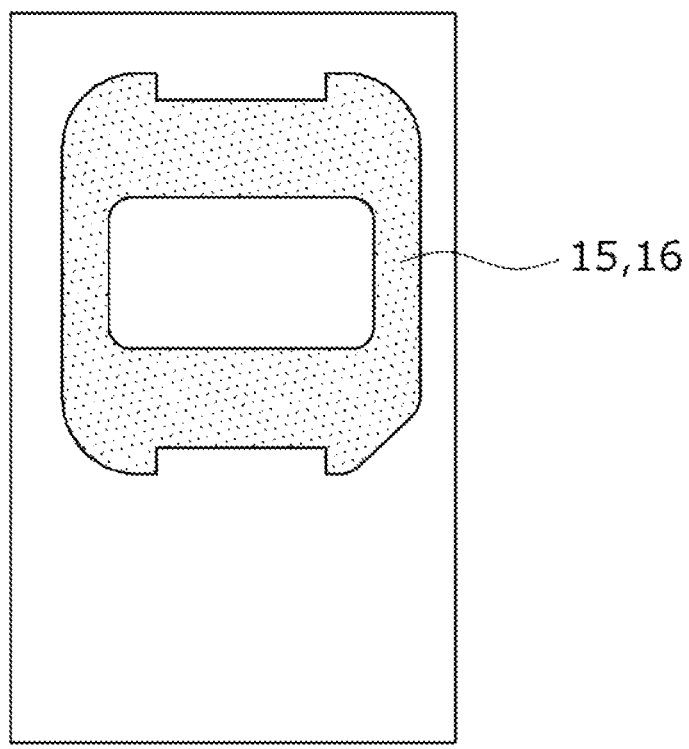
FIG. 3D is a schematic plan view illustrating the step of forming the first intermediate body in the method of manufacturing a light emitting device according to one embodiment of the present invention.
Figure 3E:
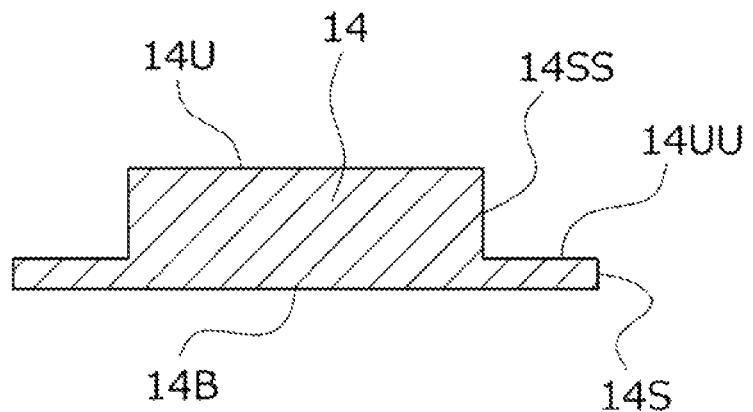
FIG. 3E is a schematic cross-sectional view illustrating the step of forming the first intermediate body in the method of manufacturing a light emitting device according to one embodiment of the present invention.

The light transmissive member 14 is a member that transmits light emitted from the light emitting element 12 and emits the light to the outside, and is bonded to the upper surface of the light emitting element 12. Examples of the light transmissive member 14 include a member that transmits 60% or greater of light from the light emitting element 12 (for example, light with a wavelength in a range of 320 nm to 850 nm), and a member that transmits 70% or greater of the light is preferably used for the light transmissive member 14. The light transmissive member 14 is preferably a plate-like member. More specifically, as illustrated in FIGS. 1A and 3E, for example, the light transmissive member 14 includes a first surface 14U, a second surface 14B opposite to the first surface 14U, and lateral surfaces 14S disposed between the first surface 14U and the second surface 14B. The first surface 14U corresponds to a light emission surface of the light emitting device 100. The second surface 14B is bonded to an upper surface, which is a main light extraction surface, of the light emitting element 12. The first surface 14U and the second surface 14B are preferably flat, and are more preferably parallel with each other. The first surface 14U of the light transmissive member 14 preferably has an area dimension smaller than that of the second surface 14B. With this structure, light emitted from the light emitting element and incident on the second surface 14B of the light transmissive member 14 can be emitted from the first surface 14U (that is, the light emission surface of the light emitting device) having the smaller area dimension. Accordingly, the light emitting area can be reduced, so that a light emitting device with an increased luminance can be obtained.

The lateral surfaces 14S of the light transmissive member 14 can be surfaces that are perpendicular to the first surface 14U and/or the second surface 14B, or can be inclined surfaces that are inclined with respect to the first surface 14U and/or the second surface 14B. As illustrated in FIG. 3E, the light transmissive member 14 can have a step portion that has a width reduced on the first surface 14U side and increased on the second surface 14B side. In this case, the light transmissive member 14 has lateral surfaces 14S (first lateral surfaces) connected with the second surface, second lateral surfaces 14SS that are connected with the first surface 14U and is located inward of the lateral surfaces 14S, and a third surface 14UU located between the second lateral surfaces 14SS and the lateral surfaces 14S. Examples of shapes of the first surface 14U and the second surface 14B of the light transmissive member 14 in a plan view include various shapes such as polygonal shapes such as a triangular shape, a rectangular shape, and the like; circular shapes, and elliptical shapes. Of these, a rectangular shape is preferable in consideration of ease of processing and having a shape corresponding to the shape of the light emitting element.

The light transmissive member 14 can be formed of an inorganic material such as glass, ceramics, or sapphire, or an organic material such as a resin or a hybrid resin containing one or more of a silicone resin, a modified silicone resin, an epoxy resin, a modified epoxy resin, an acrylic resin, a phenol resin, and a fluorine resin. The light transmissive member 14 can include a light diffusing material and a phosphor adapted to convert a wavelength of at least a portion of the incident light. Examples of the light transmissive member containing the phosphor include sintered bodies of phosphors and substances containing phosphors in the materials of the light transmissive member 14 described above. Also, a molded body of a resin, glass, ceramics, or the like with a resin layer containing a phosphor disposed on a surface of the molded body may be employed. The thickness of the light transmissive member 14 can be entirely constant, or can be partially reduced or increased. The light transmissive member 14 can have a thickness, for example, in a range of 50 μm to 300 μm. A phosphor adapted to be excited by light emitted from the light emitting element 12 is used. Examples of the phosphor adapted to be excited by light emitted from a blue light emitting element or an ultraviolet light emitting element include cerium-activated yttrium-aluminum-garnet-based phosphors (YAG:Ce), cerium-activated lutetium-aluminum-garnet-based phosphors (LAG:Ce), europium- and/or chromium-activated nitrogen-containing calcium-aluminosilicate-based phosphors (CaO-Al2O3-SiO2:Eu), europium-activated silicate based phosphors ((Sr, Ba)2 SiO4:Eu), β-SiAlON phosphor, CASN-based phosphors represented by CaAlSiN3 Eu, nitride based phosphors such as SCASN-based phosphors represented by (Sr, Ca) AlSiN3:Eu, KSF-based phosphors represented by K2SiF6:Mn, sulfide-based phosphors, and quantum dot phosphors. Combining these phosphors with a blue light emitting element or ultraviolet light emitting element allows for obtaining a light emitting device of a desired light emission color (for example, a white light emitting device). For the light diffusing material, any appropriate light diffusing material generally used in the art such as fillers of silicon oxide, titanium oxide, zirconium oxide, magnesium oxide, Aerosil, glass, glass fiber, or wollastonite; or aluminum nitride can be used.

Light-Shielding Frame 15

The light-shielding frame 15 is a member for shielding light leaked from a portion of the upper surface of the light emitting device other than the light emission surface. As illustrated in FIG. 1B and the like, the light-shielding frame 15 is disposed surrounding the light transmissive member 14 in a top view. The light-shielding frame 15 has an outer edge including a portion located above the protecting element 13. In other words, in a top view, the light-shielding frame 15 is disposed above the protecting element 13 with at least a portion of the protecting element 13 being exposed from the light-shielding frame 15. As illustrated in FIG. 1A and the like, the light-shielding frame 15 is separated from the protecting element. With the light-shielding frame 15 disposed surrounding the first surface 14U of the light transmissive member 14, the light that leaks to the outside from surfaces of the light transmissive member 14 other than the first surface 14U can be shielded in the light emitting device 100. Accordingly, the luminance of the portion of the upper surface of the light emitting device excluding the light emission surface can be reduced. As illustrated in FIGS. 3A and 3B, the light-shielding frame 15 is a plate-like member defining an opening 15a. The light-shielding frame 15 includes a first main surface 15U located at a light emitting surface side of the light emitting device and a second main surface 15B opposite to the first main surface. The opening 15a is a through-hole that extends between the first main surface 15U and the second main surface 15B. The opening 15a is preferably defined in a substantially central portion of the light-shielding frame 15. The opening 15a is preferably larger than the first surface 14U of the light transmissive member 14. In a case in which the area dimension of the first surface 14U of the light transmissive member 14 is smaller than the area of the second surface 14B as described above, the opening 15a is preferably larger than the first surface 14U of the light transmissive member 14 and is preferably smaller than the second surface 14B. In other words, in a plan view, the first surface of the light transmissive member 14 is preferably located inward of the opening 15a, and the opening 15a is preferably located inward of the second surface of the light transmissive member 14.

As illustrated in FIG. 3E, in a case in which the light transmissive member 14 includes the second lateral surfaces 14SS and the third surface 14UU, the light-shielding frame 15 is preferably disposed such that the opening 15a surrounds the second lateral surfaces 14SS of the light transmissive member 14 and overlaps the third surface 14UU in a top view. Examples of the shape of the opening 15a of the light-shielding frame 15 include various shapes, for example, polygonal shapes such as triangular shapes or square shapes, circular shapes, and oval shape. The opening 15a of the light-shielding frame 15 preferably has a shape corresponding to the shape of the light emitting element and the light transmissive member. For example, the opening 15a preferably has a rectangular shape with a size that allows the first surface 14U of the light transmissive member 14 to be located inward of the opening 15a. With such a shape, the opening 15a can be located along the outer edges of the first surface 14U of the light transmissive member 14.

The size of the opening 15a of the light-shielding frame 15 can be adjusted as appropriate according to the size and number of light emitting elements used.

While the light-shielding frame 15 can have a shape with an outer periphery of the light-shielding frame 15 coinciding an outer periphery of the light emitting device in a plan view, the light-shielding frame 15 preferably has a shape with an outer periphery located inward of the outer periphery of the light emitting device. In such a case, in a dividing step described below in which the light emitting device is divided into unit regions (that is, for each individual light emitting device), the light-shielding frame 15 is not disposed on the division lines, and misalignment of the light-shielding frame 15 and the like during division can be reduced. In a plan view, the width of the light-shielding frame 15 surrounding the light transmissive member 14 is preferably 130 μm or greater in consideration of increasing the luminance difference between the inside and the outside of the light emission surface of the light emitting device. Considering ease of handling in the manufacturing process, the width is more preferably 500 μm or greater. The width of the light-shielding frame 15 can be constant across the entire length or can be partially different. In a case in which the width of the light-shielding frame 15 is partially different, the light-shielding frame 15 preferably has a width of at least 130 μm or greater over the entire length and more preferably has a width of 500 μm or greater partially. As used herein, the "width of the light-shielding frame 15" refers to a distance between the opening 15a and the outer periphery of the light-shielding frame 15. In other words, the "width of the light-shielding frame 15" refers to a distance between an inner periphery to the outer periphery of the light-shielding frame in a plan view. In a plan view, the light-shielding frame 15 preferably defines an outer peripheral recess 15b recessed inward in the outer periphery of the light-shielding frame 15. In this case, in the first intermediate body, the outer peripheral recess 15b is preferably located above the protecting element. This allows for facilitating disposing the protecting element proximate to the light emitting element in the first intermediate body and placing the protecting element such that a portion of the protecting element is exposed from the light-shielding frame in a top view.

For the light-shielding frame 15, for example, a member that reflects and/or absorbs light from the light emitting element is preferably used. Examples of the material constituting the light-shielding frame 15 include resins (including a fiber-reinforced resin), ceramics, glass, paper, metals, and composite materials formed from two or more types of these materials. In consideration of having good light-shielding properties and being difficult to degrade, the light-shielding frame 15 is preferably constituted by a metal frame made of metal or a frame provided with a metal film on a surface of the frame. Examples of the metal material include copper, iron, nickel, chromium, aluminum, gold, silver, titanium, and alloys thereof.

The light-shielding frame 15 more preferably has a function of not only reducing leakage light from the inside of the light emitting device, but also reducing reflection of light traveling from the outside. The function of reducing the reflection of light traveling from the outside is achieved by, for example, having small irregularities in a surface at the light emission surface side, using a material with high light absorptance, and the like. The small irregularities have an average arithmetic roughness Ra in a range of 0.5 μm to 1.0 μm. With the small irregularities in a surface of the light-shielding frame 15, wettability to the liquid on the light-shielding frame surface may be increased, and the uncured resin material may be easily wet-spread to the surface of the light-shielding frame. Therefore, it is preferable that the small irregularities are not formed in the periphery of the first main surface of the light-shielding frame 15. The use of materials having high light absorptance is achieved by black nickel plating, black chromium plating, and the like. The light-shielding frame 15 preferably has a thickness in a range from 20 μm to 200 μm, and more preferably in a range from 30 μm to 80 μm, in consideration of lightness, resistance to deformation, and the like while maintaining the strength when used as a light emitting device.

The first intermediate body 10 can be provided by purchasing or by undergoing some or all of the manufacturing steps, such as through steps of providing the substrate 11, the light emitting element 12, the protecting element 13, the light transmissive member 14, and the light-shielding frame 15 and assembling the first intermediate body 10 having the configuration described above. For example, the second intermediate body 20 including the light transmissive member 14, the light-shielding frame 15, and the third cover member that bonds the light transmissive member 14 and the light-shielding frame 15 can be provided, and the first intermediate body 10 can be provided using the provided second intermediate body 20.

Providing Second Intermediate Body 20

Figure 3F:
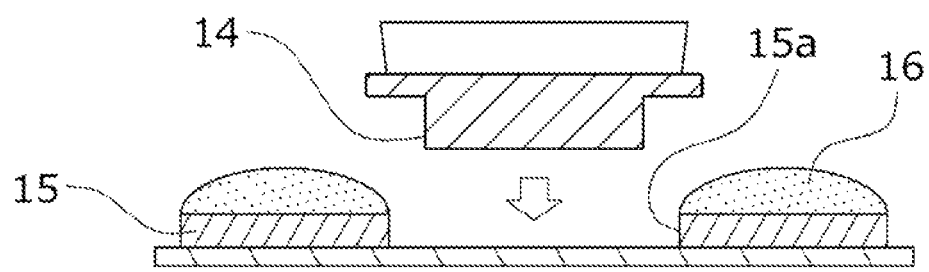
FIG. 3F is a schematic cross-sectional view illustrating the step of forming the first intermediate body in the method of manufacturing a light emitting device according to one embodiment of the present invention.
Figure 3G:
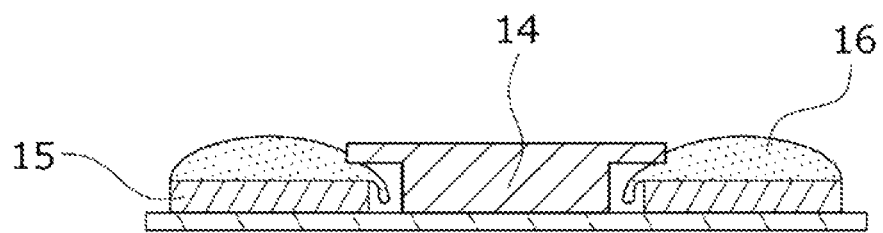
FIG. 3G is a schematic cross-sectional view illustrating the step of forming the first intermediate body in the method of manufacturing a light emitting device according to one embodiment of the present invention.
Figure 3J:
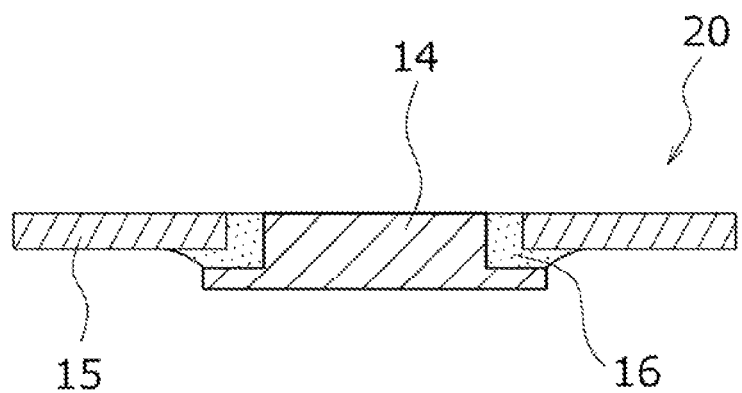
FIG. 3J is a schematic cross-sectional view illustrating the step of forming a first intermediate body in the method of manufacturing a light emitting device according to one embodiment of the present invention.

As illustrated in FIG. 3J, for example, the second intermediate body 20 includes the light transmissive member 14, the light-shielding frame 15, and the third cover member 16. The light transmissive member 14 includes, for example, the first surface 14U, the second surface 14B, and the lateral surfaces 14S, as described above. Furthermore, as illustrated in FIG. 3E, the light transmissive member 14 can include the third surface 14UU and the second lateral surfaces 14SS. As illustrated in FIGS. 3A and 3B, the light-shielding frame 15 defines the opening 15a, for example. The opening 15a is defined by inner lateral surfaces of the light-shielding frame 15.

Third Cover Member

As illustrated in FIG. 3J, for example, the third cover member 16 is a member that bonds the light-shielding frame 15 and the light transmissive member 14. More specifically, the third cover member 16 covers the inner lateral surfaces of the light-shielding frame 15 that define the opening 15a and the second lateral surfaces 14SS of the light transmissive member 14, and bonds the light-shielding frame 15 and the light transmissive member 14. The third cover member 16 can be a light transmissive member, but is preferably a reflective member. The third cover member 16 can be formed of, for example, a mixed material of a resin and a light reflective material. A thermosetting resin or a thermoplastic resin can be used for the resin. Specific examples of the resin include epoxy resins, silicone resins, modified epoxy resins, modified silicone resins, polyester resins, polyimide resins, modified polyimide resins, polyphthalamide (PPA), polycarbonate resins, polyphenylene sulfide (PPS), liquid crystal polymer (LCP), ABS resins, phenol resins, acrylic resins, and PBT resins. Among these, a thermosetting resin such as an epoxy resin, or a silicone resin having high heat resistance and light resistance is preferably used. For the light reflective material, a member that does not easily absorb light from the light emitting element and has a refractive index greatly different from that of the resin material is preferably used. Examples of such a light reflective material include titanium oxide, zinc oxide, silicon oxide, zirconium oxide, aluminum oxide, and aluminum nitride. The light reflective material in a range of 5 wt. % or greater and 90 wt. % or less of the resin can be contained in the resin.

To provide the second intermediate body 20, the light-shielding frame 15 including the opening 15a is provided, as illustrated in FIGS. 3A and 3B. In this example, the first main surface of the light-shielding frame 15 is preferably secured on a support such as a sheet 17. Next, as illustrated in FIGS. 3C and 3D, the third cover member 16 is disposed on the light-shielding frame 15. The third cover member 16 is preferably disposed on substantially the entire second main surface of the light-shielding frame 15. The viscosity and the amount of the third cover member 16 is adjusted such that the third cover member 16 is wet-spread on substantially the entire second main surface of the light-shielding frame 15 and does not flow into the opening 15a of the light-shielding frame 15. In this example, a surface of the light-shielding frame opposite to a surface at the light emitting surface side of the light emitting device is described as an upper surface. Next, as illustrated in FIG. 3F, the light transmissive member 14 is disposed within the opening 15a of the light-shielding frame 15. As illustrated in FIG. 3E, the light transmissive member 14 includes the first surface 14U, the second surface 14B opposite the first surface 14U, the third surface 14UU disposed between the first surface 14U and the second surface 14B, the lateral surfaces 14S disposed between the first surface 14U and the second surface 14B, and the second lateral surfaces 14SS located inward of the lateral surfaces 14S in a plan view. The size of the first surface 14U is smaller than the opening 15a of the light-shielding frame 15 in a plan view, and the size of the second surface 14B is larger than the opening 15a of the light-shielding frame 15, and is smaller than an outer edge of the light-shielding frame 15. Then, the light transmissive member 14 is disposed in the opening 15a using a collet or the like. At this time, as illustrated in FIG. 3G, the third cover member 16 disposed on the light-shielding frame 15 is pressed downward by the third surface 14UU of the light transmissive member 14, and is moved into a gap between the second lateral surfaces 14SS of the light transmissive member 14 and the inner lateral surfaces of the light-shielding frame 15 (in other words, the inner lateral surfaces of the light-shielding frame 15 defining the opening 15a). Accordingly, as illustrated in FIG. 3H, a sink occurs in an outer surface of the third cover member 16, creating a fillet between the light-shielding frame 15 and the light transmissive member 14. In other words, the third cover member 16 disposed on the light-shielding frame 15 is pressed downward by the light transmissive member 14, causing the third cover member 16 to move into a gap between the opening 15a and the light transmissive member 14, thus a portion of the third cover member 16 remaining on the light shielding frame 15 assumes a shape conforming to the light transmissive member 14 in order to maintain a smaller surface area due to the surface tension. In this example, the third cover member disposed on the entire surface of the second main surface of the light-shielding frame 15 assumes a shape conforming to the second surface of the light transmissive member 14 in a plan view, which allows for visually confirming that the third cover member has moved into a gap between the opening 15a and the lateral surfaces 14S of the light transmissive member 14. Thereafter, the third cover member 16 is cured, which causes the light transmissive member 14 and the light-shielding frame 15 to be bonded together. At this time, as illustrated in FIGS. 3H and 3I, the light transmissive member 14 and the light-shielding frame 15 are bonded such that the first surface 14U of the light transmissive member 14 and a surface of the light-shielding frame 15 are substantially in the same plane. In this manner, as illustrated in FIG. 3J, the second intermediate body 20 can be obtained. Alternatively, the second intermediate body 20 can be provided by purchasing or the like.

Next, the substrate 11 on which the light emitting element 12 and the protecting element 13 illustrated in FIG. 2B are mounted is provided, and the obtained second intermediate body 20 is bonded to the upper surface of the light emitting element. At this time, the second intermediate body 20 is disposed on the light emitting element such that a portion of the light-shielding frame 15 covers a portion on the protecting element 13 and exposes other portions thereof in a top view, and the upper surface of the light emitting element 12 and the second surface 14B of the light transmissive member are bonded. Accordingly, as illustrated in FIGS. 1A and 1B, the first intermediate body 10 can be obtained that includes the substrate, the light emitting element mounted on the upper surface of the substrate via the plurality of first bonding members, the protecting element mounted on the upper surface of the substrate via the second bonding member and separated from the light emitting element, the light transmissive member bonded to the upper surface of the light emitting element, and the light-shielding frame surrounding the light transmissive member in a top view and including an outer periphery including a portion located above the protecting element such that at least a portion of the protecting element is exposed from the light-shielding frame in a top view. In the first intermediate body 10, a portion of the protecting element 13 is exposed from the light-shielding frame 15 in a top view at a side (i.e., outside) opposite the side facing the light emitting element 12.

Disposing First Resin 19a

Next, a first resin 19a is disposed on the substrate 11. In a step of disposing the first resin 19a, the first resin 19a is applied on the substrate 11 outside the portion of the protecting element 13 exposed from the light-shielding frame 15 in a top view to cause the applied first resin 19a to move toward the light emitting element 12 along the protecting element 13, so that the first resin is disposed between the light emitting element 12 and the substrate 11. As illustrated in FIGS. 1C and 1D, the first resin 19a is applied on the substrate 11 in the first intermediate body 10 outside the portion of the protecting element 13 exposed from the light-shielding frame 15 in a top view. In this case, the first resin 19a is preferably applied such that a portion of the applied first resin 19a comes into contact with the lateral surface and/or the upper surface of the protecting element 13. This allows the applied first resin 19a to be moved toward the light emitting element along the lateral surfaces and/or the upper surface of the protecting element 13. As illustrated in FIG. 1D, for example, the first resin 19a is applied onto the substrate 11 in a region M along a first direction X, which is a direction parallel to the lateral surface of the light emitting element 12 that faces the protecting element 13. In this case, the first resin 19a is preferably applied on the substrate 11 at least over a distance longer than a length of one side of the light emitting element 12. Accordingly, the first resin 19a that is applied is more easily moved toward the light emitting element 12 along the lateral surface of the protecting element. The first resin 19a that has moved toward the light emitting element is further wet-spread between the light emitting element and the substrate, and between the plurality of first bonding members S1, and thus, the first resin 19a can be efficiently disposed between the light emitting element 12 and the substrate 11. In this case, as illustrated in FIG. 1E, adjusting the amount of the first resin 19a applied on the substrate allows the first resin 19 to be moved toward a side of the light emitting element 12 opposite to the side facing the protecting element 13 along a lateral side of the light emitting element 12 and through a gap between the light emitting element 12 and the substrate. In particular, with the wirings 11a disposed directly below the region where the protecting element 13 and the light emitting element 12 are disposed, using a material having high wettability to the resin material for the outermost surface of the wirings 11a allows for facilitating the first resin 19a to be disposed around the light emitting element 12.

Any appropriate methods known in the art can be used for applying the first resin 19a, for example. For example, a discharge device (resin discharge device) configured to discharge a liquid resin with air pressure or the like at continuous and constant discharge flow rate can be used (see JP 2009-182307 A). In a case in which a discharge device is used, the movement speed of the needle of the discharge device is preferably constant. The first resin 19a can be applied to the region described above, for example, once or a plurality of times in the first direction. The first resin 19a is preferably applied to a collected body in which a plurality of light emitting devices are arranged in a matrix. This allows for applying the first resin to the application region at a uniform applying amount with a constant discharge flow rate.

The first resin 19a can be a light transmissive resin, but is preferably a light reflective resin. Such a resin can be selected from among the resins described above as examples of the third cover member 16. Examples of such resins include the resins described above as examples of the third cover member 16 containing light reflective materials such as titanium oxide, zinc oxide, silicon oxide, zirconium oxide, aluminum oxide, or aluminum nitride, in a range of 5 wt. % or greater and 90 wt. % or less with respect to the resin. The first resin 19a can contain, instead of the light reflective material or in addition to the light reflective material, a wavelength conversion material or pigment for adjusting the color, a filler for adjusting the viscosity, and the like. The viscosity of the first resin can be in a range of 0.5 Pa·s to 30 Pa·s when applied, and is preferably in a range of 4 Pa·s to 20 Pa·s. Such adjustment in viscosity allows the first resin 19a to be appropriately moved toward the light emitting element along the protecting element.

Obtaining First Cover Member

Next, the first resin 19a is cured to obtain the first cover member. As described above, after the first resin 19a has been moved and disposed in place, the first resin 19a can be cured to obtain the first cover member 19. The curing can be appropriately adjusted according to the material to be used, the amount thereof, and the like. For example, the curing can be performed by UV irradiation or heating.

Forming Second Cover Member 24

It is preferable that the method of manufacturing a light emitting device according to the present embodiment further includes forming the second cover member covering the first cover member 19 and the lateral surface of the light-shielding frame 15 on the substrate, after the step of disposing the first resin material or after the step of obtaining the first cover member. The step of forming the second cover member 24 is performed either after the first resin 19a is disposed between the light emitting element and the substrate or after the first cover member 19 is obtained, that is, before or after the first resin 19a is cured. In this example, as illustrated in FIG. 1F, the second cover member 24 covering the first cover member 19 and the lateral surfaces of the light-shielding frame 15 is preferably formed on the substrate 11. Accordingly, the light emitting device illustrated in FIGS. 1F, 1G, and 1H can be obtained. A resin material is preferably used for the second cover member 24 similarly to the first cover member 19. A material similar to that of the first resin 19a can be used for the resin material. The second cover member 24 can be formed, for example, by injection molding, compression molding, transfer molding, or resin application by potting, as in the first cover member 19.

Second Embodiment: Method of Manufacturing Light Emitting Device 200

Figure 4A:
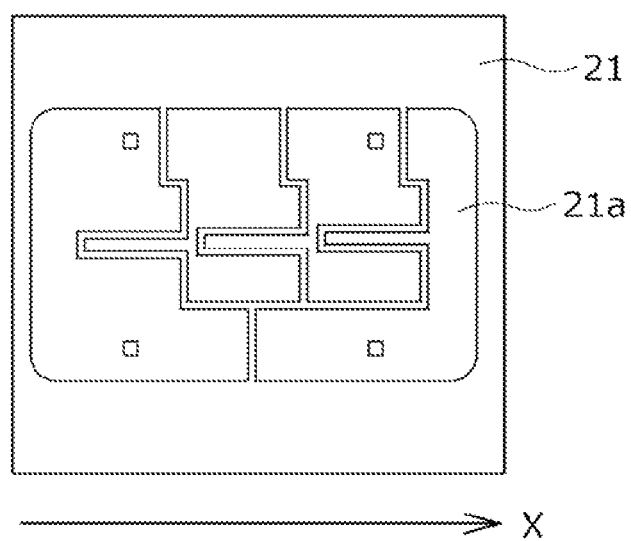
FIG. 4A is a schematic plan view illustrating a substrate used in a method of manufacturing a light emitting device according to another embodiment of the present invention.
Figure 4B:
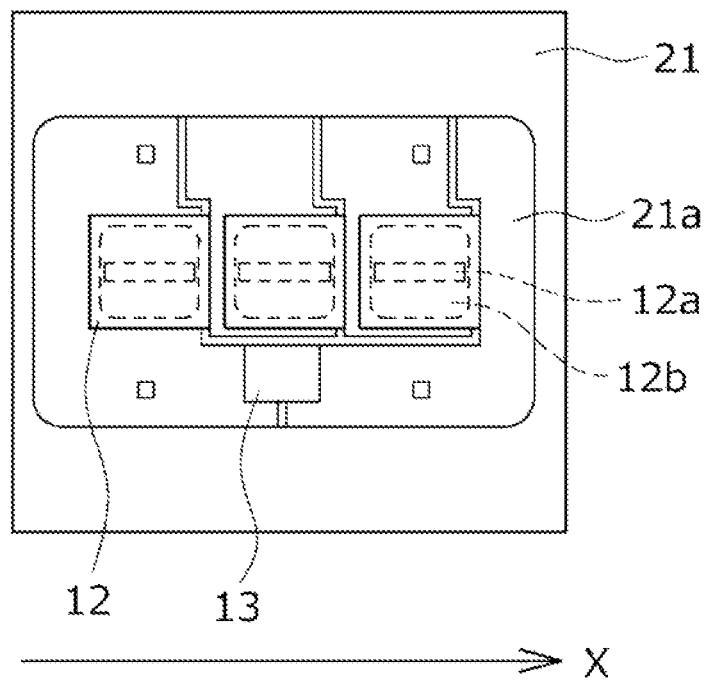
FIG. 4B is a schematic plan view illustrating a state in which a light emitting element and a protecting element are mounted on a substrate used in the method of manufacturing a light emitting device according to another embodiment of the present invention.

A manufacturing method according to the second embodiment is the same as the method of manufacturing the light emitting device 100 except for the differences described below. In the present embodiment, the light emitting device 200 includes a plurality of light emitting elements 12, that is, two or more light emitting elements 12 for a single first intermediate body 10. For the substrate, for example, as illustrated in FIG. 4A, a substrate 21 including wirings 21a on a surface thereof can be used. In the case of including two or more light emitting elements, the plurality of light emitting elements 12 are preferably disposed to have a rectangular shape in a plan view on the substrate 21 as a whole. In particular, as illustrated in FIG. 4B, in a case in which a light emitting device having a narrow width of light distribution is to be obtained, a plurality of light emitting elements 12 are preferably aligned in a single row. In this example, as described above, the light emitting element 12 includes the first electrode 12a disposed on a central portion thereof and the second electrode 12b disposed at both sides of the first electrode 12a. As illustrated in FIG. 4B, the plurality of light emitting elements 12 are disposed in a single row along a first direction X are such that the second electrodes 12b and the first electrodes 12a of the plurality of light emitting elements 12 in a single row along the first direction X. As described above, in a case in which the plurality of light emitting elements 12 are used, as illustrated in FIG. 4B, the protecting element 13 is preferably disposed on a line parallel to the first direction, spaced apart from all of the light emitting elements, and facing one or two of the light emitting elements. Such an arrangement allows the first resin described below to be easily moved toward the light emitting elements, that is, between adjacent ones of the light emitting elements, between each light emitting element and the substrate, and/or between the first electrode and the second electrode.

Figure 5A:
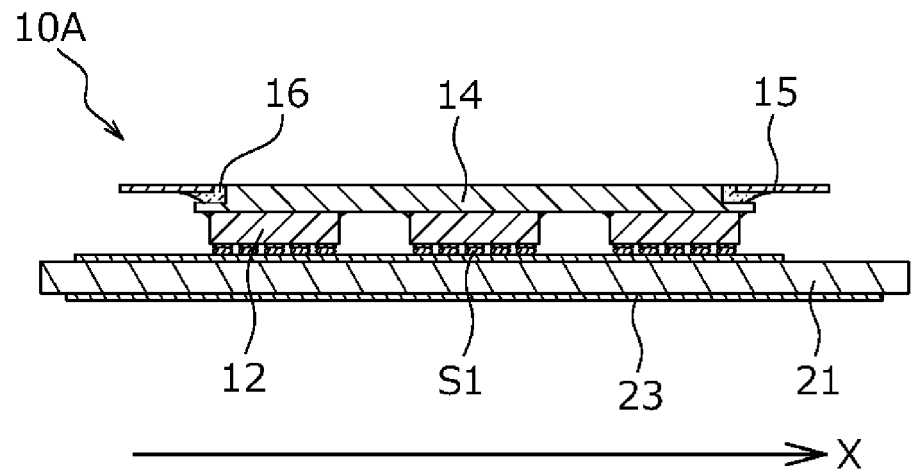
FIG. 5A is a schematic cross-sectional view (cross-sectional view taken along line V-V' of FIG. 5B) illustrating a method of manufacturing a light emitting device according to another embodiment of the present invention.
Figure 5B:
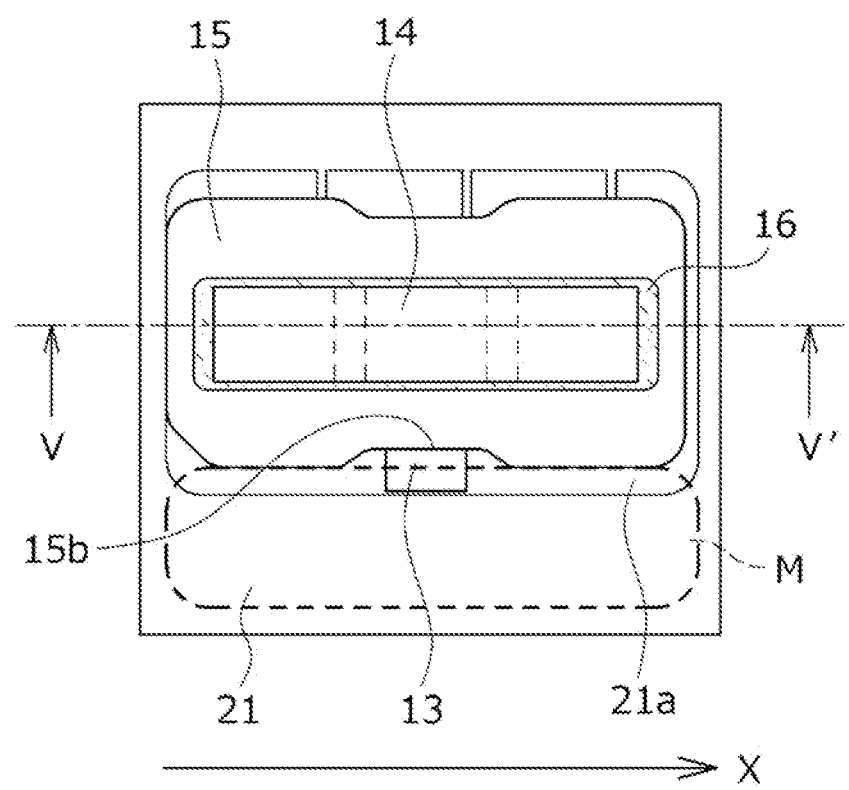
FIG. 5B is a schematic plan view illustrating the method of manufacturing a light emitting device according to another embodiment of the present invention.

Next, as illustrated in FIG. 3J, the second intermediate body 20 to which the light transmissive member 14 and the light-shielding frame 15 are bonded by the third cover member 16 is disposed on the substrate 21 to which the light emitting element 12 and the protecting element 13 are bonded. In this example, as described above, the second intermediate body 20 is disposed such that the upper surface of all of the light emitting elements 12 and the second surface 14B of the light transmissive member 14 face to each other. In addition, the second intermediate body 20 is disposed such that a portion of the light-shielding frame 15 covers a portion of the protecting element 13 and exposes other portions in a top view, that is, such that a portion of the outer periphery of the light-shielding frame 15 is disposed above the protecting element 13. In this manner, the second intermediate body 20 is disposed on the light emitting element 12, and the upper surface of the light emitting element 12 and the second surface 14B of the light transmissive member 14 are bonded together. This can result in obtaining the first intermediate body 10A as illustrated in FIGS. 5A and 5B. The protecting element 13 is partially exposed from the light-shielding frame 15 in a top view on a side (i.e., outside) opposite the side facing the light emitting element 12.

Figure 5C:
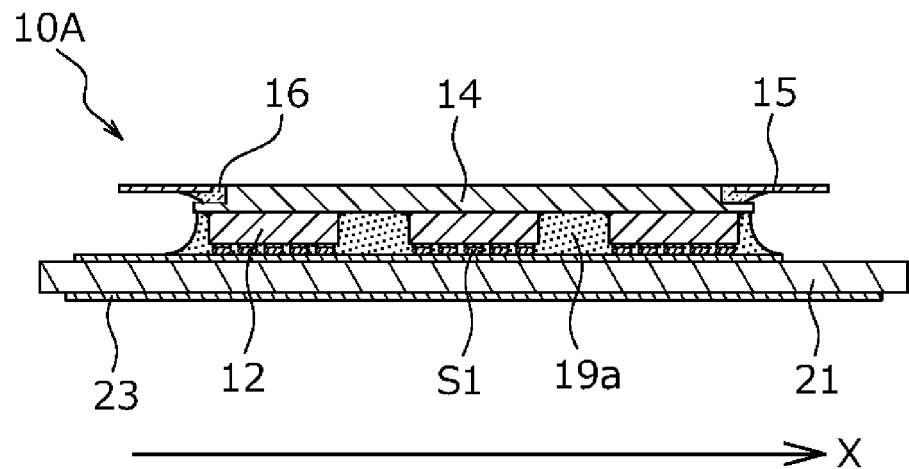
FIG. 5C is a schematic cross-sectional view illustrating the method of manufacturing a light emitting device according to another embodiment of the present invention.
Figure 5D:
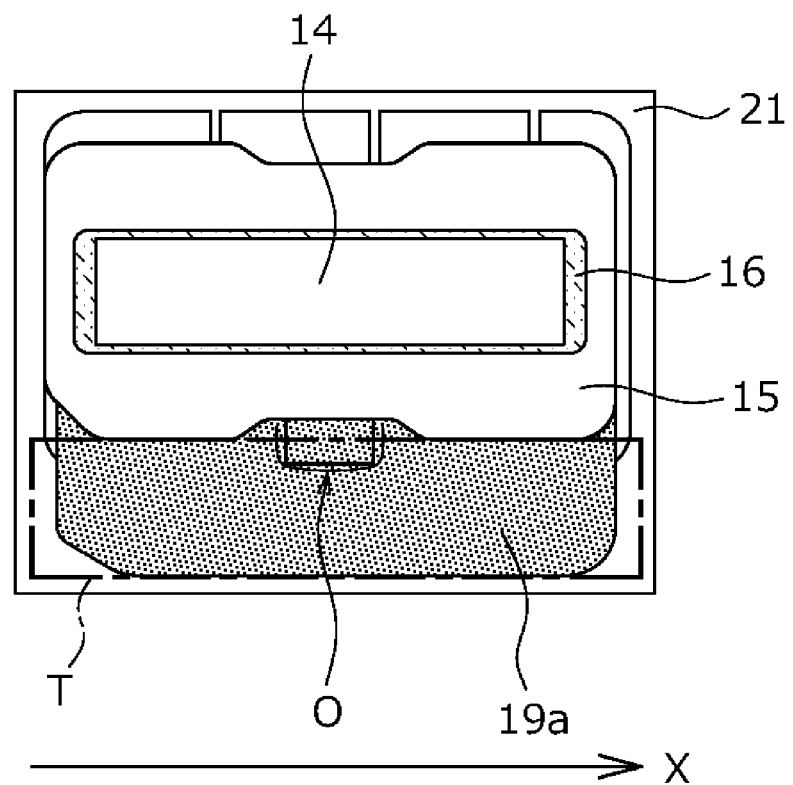
FIG. 5D is a schematic plan view illustrating the method of manufacturing a light emitting device according to another embodiment of the present invention.
Figure 5E:
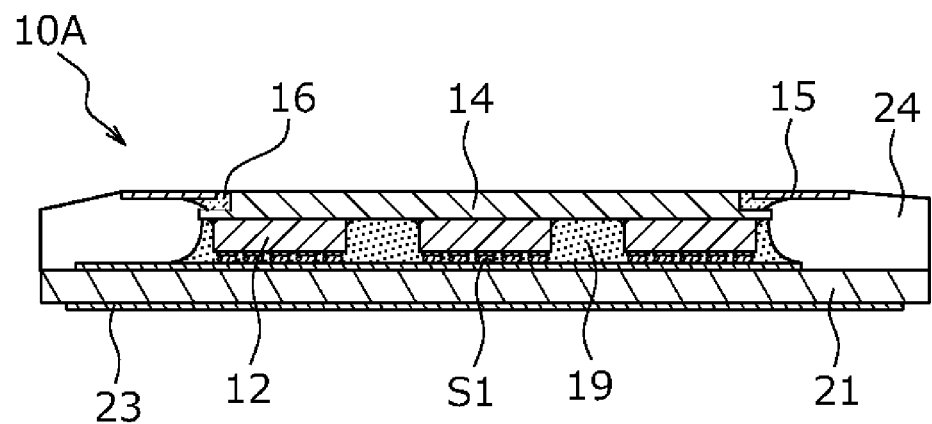
FIG. 5E is a schematic cross-sectional view illustrating a light emitting device manufactured by the method of manufacturing a light emitting device according to another embodiment of the present invention.
Figure 5F:
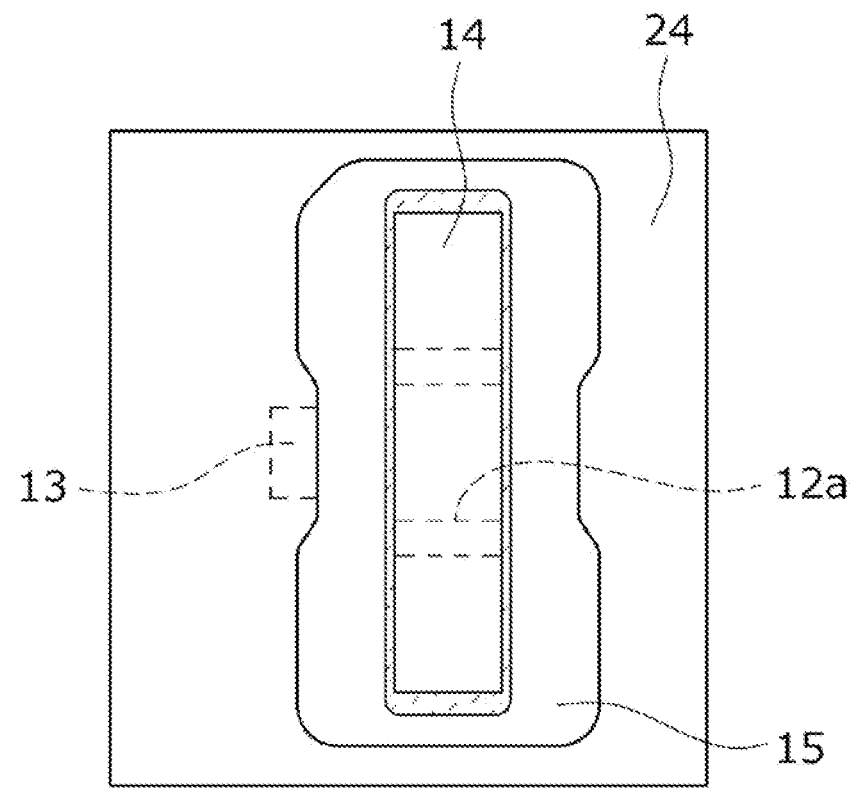
FIG. 5F is a schematic plan view of the light emitting device of FIG. 5E.
Figure 5G:
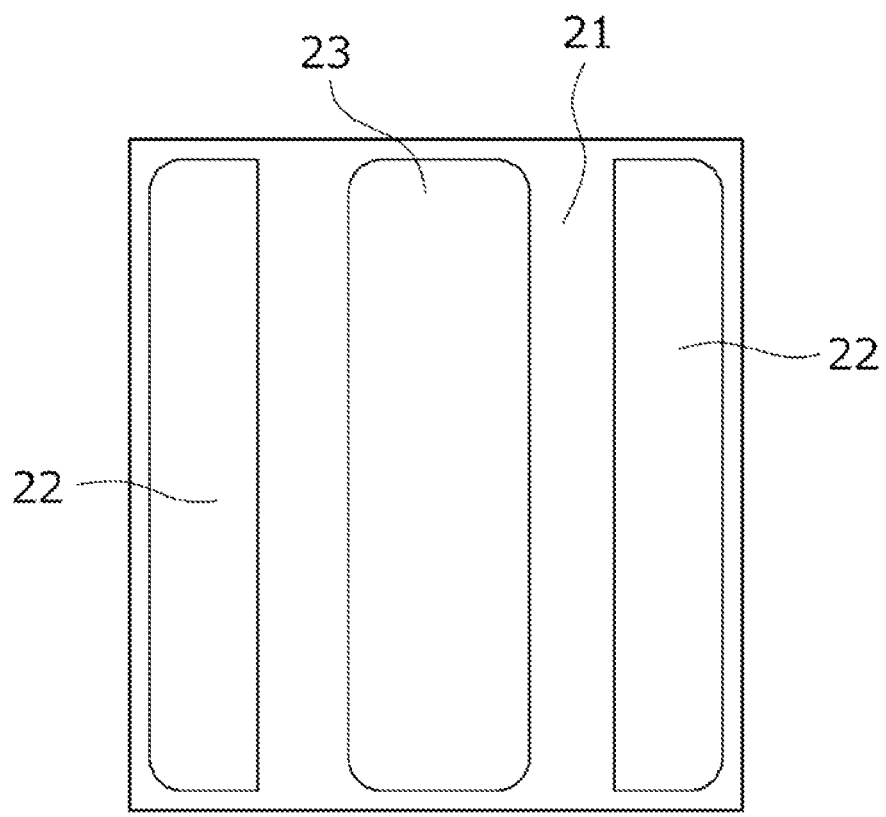
FIG. 5G is a schematic bottom view of the light emitting device of FIG. 5E.

Next, the first resin 19a is applied on the substrate 11 in the first intermediate body 10 outside the portion of the protecting element 13 exposed from the light-shielding frame 15 in a top view. In this case, the first resin is preferably applied so as to be brought into contact with the lateral surfaces and/or the upper surface of the protecting element 13. As a result, the applied first resin can be moved toward the light emitting element along the lateral surfaces and/or the upper surface of the protecting element. For example, as illustrated in FIGS. 5A and 5B, the first resin is preferably applied to the region M extending for a distance longer than the long side of the rectangular region in which the plurality of light emitting elements are disposed in a rectangular shape along the first direction X in which the light emitting elements 12 are disposed. This allows for applying an amount of first resin sufficient for the first resin applied to the outside of the protecting element to move toward the light emitting element 12 along the protecting element 13 and to be disposed between the light emitting elements 12 arranged in a single row and the substrate. Accordingly, as illustrated in FIGS. 5C and 5D, the first resin 19a can be disposed between the light emitting elements 12 and the substrate 11. In this case, as illustrated in FIG. 5C, adjustment of the amount of the first resin applied on the substrate allows the first resin to be moved toward a side of the light emitting elements 12 opposite to the side facing the protecting element 13 along lateral sides of the light emitting elements 12, along a gap between the light emitting elements 12, and through a gap between the light emitting elements 12 and the substrate 21. Except for the steps described above, the light emitting device illustrated in FIGS. 5E, 5F, and 5G can be obtained in a manner as in the first embodiment. The pair of positive and negative electrodes 22 for external connection are disposed on the lower surface of the light emitting device. Furthermore, the heat dissipation terminal 23 is disposed between the positive and negative electrodes 22.

Third Embodiment: Method of Inspecting Light Emitting Device

A method of inspecting a light emitting device according to the third embodiment includes: providing a first intermediate body including a substrate, a plurality of first bonding members, a second bonding member, a light emitting element mounted on an upper surface of the substrate via the plurality of first bonding members, a protecting element mounted on the upper surface of the substrate via the second bonding member and spaced apart from the light emitting element, a light transmissive member bonded to an upper surface of the light emitting element, and a light-shielding frame surrounding the light transmissive member in a top view, a portion of an outer periphery of the light-shielding frame being located above the protecting element such that at least a portion of the protecting element is exposed from the light-shielding frame in the top view; disposing a first resin between the light emitting element and the substrate by applying the first resin on the substrate in a region outside of the portion of the protecting element exposed from the light-shielding frame in the top view such that the first resin moves toward the light emitting element along the protecting element; defining an inspection region on the substrate in the region outside of the portion of the protecting element exposed from the light-shielding frame in the top view; and after the disposing of the first resin, inspecting whether the first resin is disposed between the light emitting device and the substrate by detecting a shape of the first resin covering the inspection region. According to the method of inspecting according to the present embodiment, whether the resin member surrounding the light emitting element is disposed in place can be easily confirmed even when the light emitting device is provided with the light-shielding frame.

A method of inspecting a light emitting device according to the third embodiment includes the step of providing the first intermediate body (for example, FIGS. 3A to 3J, FIGS. 1A and 1B) and the step of disposing the first resin 19a (FIGS. 1C and 1D) that are the same as in the method of manufacturing a light emitting device described above, and also includes defining a region on the substrate outside the protecting element exposed from the light-shielding frame as an inspection region, and, after the disposing of the first resin 19a, inspecting whether the first resin 19a is disposed between the light emitting element and the substrate by determining an area dimension (one example of detecting a shape) of the first resin 19a covering the inspection region.

Defining Inspection Region

As illustrated in FIG. 1F, a region on the substrate 11 outside the portion of the protecting element 13 exposed from the light-shielding frame 15 in a top plan view is defined as an inspection region T. In this example, the inspection region T is, at least, in a plan view, a region on the substrate 11 outside the protecting element 13 (in other words, on the opposite side to the light emitting element 12). More specifically, the inspection region T is preferably a region including a lateral surface of the protecting element 13 opposite to a lateral surface of the protecting element 13 facing the light emitting element 12, that is, a region including a lateral surface of the protecting element 13 exposed from the light-shielding frame 15 in a plan view. Furthermore, the region is preferably a region having a length corresponding to a lateral surface of the light emitting element 12 facing the protecting element 13, and more preferably is a region on the substrate 11 having a length corresponding to one side of the light-shielding frame 15 that includes an outer edge located above the protecting element 13 (region T in FIG. 1D). For example, the inspection region T can be a region with an area dimension 1 to 2 times larger than an area obtained by multiplying a length corresponding to one side of the light-shielding frame 15 in the first direction parallel to the lateral surface of the light emitting element 12 facing the protecting element 13 and a length of the protecting element in a direction orthogonal to the first direction. From another perspective, the inspection region T can be set to a region in which the first resin 19a is applied onto the substrate 11 in the step of disposing the first resin 19a.

Inspection

After the step of disposing the first resin 19a, the shape of the first resin 19a covering the inspection region T described above is observed. In the step of disposing the first resin, for example, when the first resin 19a is applied to the outside of the portion of the protecting element 13 exposed from the light-shielding frame 15 in a top view in the first direction, the first resin moves toward the light emitting element along the lateral surfaces of the protecting element and/or through a gap between the protecting element and the substrate, and after a predetermined period of time elapses, the movement of the first resin is nearly stopped, which allows inspection. The first resin moves quickly in a narrower gap due to capillary action. Depending on the viscosity of the resin and the wettability of the material, it becomes possible to inspect the first resin, for example, after 10 seconds to 70 seconds after application. With such movement of the first resin, the first resin disposed in the region where the first resin has been applied, for example, the first resin disposed in the inspection region T described above, is sunk toward the light emitting element, which reduces the volume of the first resin in the inspection region T, resulting in change of the shape of the first resin in the inspection region T. Thus, when the first resin assumes a shape different from a shape in which the first resin has been disposed, the first resin can be considered to have moved toward the light emitting element 12.

Typically, in a case of disposing a resin member between the light emitting element and the substrate after mounting the light emitting element on the substrate, the resin member disposed between the light emitting element and the substrate assumes a shape conforming to the light emitting element in a plan view due to surface tension of the resin member after disposing the resin member (e.g. the shape of the third cover member 16 illustrated in FIG. 3I conforming to the light transmissive member 14), which allows for determining that the resin member is disposed directly below the light emitting element. However, in the method of manufacturing a light emitting device according to the present embodiment, the shape of the first resin around the light emitting element cannot be visually confirmed due to presence of the light-shielding frame 15. Accordingly, by observing the change in the external shape caused by the sink of the first resin in the region in which the first resin has been applied, inspection for the appropriate spread state toward the light emitting element can be performed.

For a shape observation of the first resin in the inspection region, for example, a change in the thickness of the first resin on the substrate is observed. For example, the change in the thickness can be determined by observing a portion of the first resin at the periphery of the protecting element 13. The first resin moves toward the light emitting element along the protecting element, and the first resin that has stopped moving maintains a state with a smaller surface area due to surface tension. Therefore, in a case in which a sufficient amount of the first resin is moved between the light emitting element and the substrate, a change in the thickness of the first resin that has stopped moving can be observed in the region along the protecting element. More specifically, as illustrated in FIGS. 1F and 5D, it can be determined as acceptable by observing that the first resin includes a portion having an outline O that generally conforms to the outer shape of the portion of the protecting element exposed from the light-shielding frame in a top plan view. In a case in which the movement toward the element is insufficient, the surface area of the first resin is maintained small at the position where the first resin is applied, so that sinking of the first resin around the protecting element is hardly observed. Thus, inspection for the appropriate spread state toward the light emitting element can be performed by detecting a sufficiently thin portion of the first resin in the inspection region with the presence of a portion of the first resin having an outline that generally conforms to the outer shape of the exposed portion of the protecting element.

Fourth Embodiment: Method of Inspecting Light Emitting Device

A method of inspecting a light emitting device according to the fourth embodiment includes providing a first intermediate body using a plurality of light emitting elements as illustrated in FIGS. 5A and 5B and the step of disposing the first resin 19a as illustrated in FIGS. 5C and 5D in the method of manufacturing a light emitting device described above, and also includes defining a region on the substrate 11 outside the portion of the protecting element 13 exposed from the light-shielding frame 15 in a top plan view as the inspection region T, and inspecting that the first resin 19a is disposed between the light emitting element and the substrate by determining an area dimension of the first resin 19a covering the inspection region after the first resin 19a is disposed. The inspection region T is, for example, as illustrated in FIG. 5D, preferably at least a region on the substrate 11 in a plan view including a region outside the protecting element 13, a lateral surface of the protecting element 13 opposite to the light emitting element 12 and a portion of a lateral surface adjacent to a lateral surface on the outside of the protecting element 13. Furthermore, the inspection region T more preferably includes a region on the substrate 11 that further includes a region of length corresponding a length between two opposite ends of a row of the plurality of light emitting elements 12 disposed outside the protecting element 13, or a region on the substrate 11 that has a length corresponding to one side of the light-shielding frame 15 outside the protecting element 13 (the region T in FIG. 5D). The inspection step after disposing the first resin 19a is the same as that in the third embodiment, and the same effects as those of the third embodiment can be obtained.

First Experimental Example

A collective substrate was provided in which the three light emitting elements 12 each having a substantially square shape in a plan view with one side of 800 μm and a height of 150 μm are arranged in a row, the protecting element 13 having a substantially rectangular shape in a plan view with an upper surface of 350×500 μm and a height of 140 μm is disposed with a long side facing the light emitting element 12, and the first intermediate body 10 including the light transmissive member 14 with a size of the first surface of 600×2700 μm and a size of the second surface of 900×2700 μm, the light-shielding frame 15 with a size of the first main surface (excluding the outer peripheral recess) of 1.7×3.3 mm, and the opening 15a with a size of 700×2900 μm is disposed in a matrix shape. Thirty Au bumps were disposed directly below the light emitting element 12 as the first bonding members, and four Au bumps were disposed directly below the protecting element as the second bonding members. The distance between the light emitting element 12 and the protecting element 13 was approximately 150 μm. The outer peripheral recess 15b of the light-shielding frame 15 was a recess of 100 μm recessed from an outer peripheral side where the outer peripheral recess was formed, and the protecting element 13 was exposed from the outer peripheral recess of the light-shielding frame in a top view. A silicone resin containing titanium oxide at 37.5 wt. % was provided as the first resin. The viscosity of this first resin was 11 Pa·s.

As illustrated in FIGS. 5C and 5D, the first resin 19a was applied along the first direction on the substrate 11 in the first intermediate body 10 outside the portion of the protecting element 13 exposed from the light-shielding frame 15 in a top view such that the first resin comes into contact with the upper surface of the protecting element 13. At this time, the application along the first direction at a single application amount of 0.033 mg for each first intermediate body was performed six times sequentially along the first direction. After 70 seconds of the application of the first resin, it was confirmed that the movement of the first resin was nearly stopped, and the area dimension of the first resin covering the inspection region T in FIG. 5D was measured. As a result, a value of 0.65 $mm^2$ or greater was able to be obtained when the number of discharges was six times or three times, and in this case, the first resin was observed from the lateral surface, and it was confirmed that the first resin 19a was appropriately disposed between all of the light emitting elements 12 and the substrate 11. Therefore, it was confirmed that the shape observation of the first resin in the inspection region T is effective in inspection for the positioning of the first resin in place.

In the description above, certain embodiments of the present invention are described. However, the present invention is not limited to the description above, and should be broadly construed on the basis of the claims. The present invention also encompasses variations and modifications that are made on the basis of the description above.

What is claimed is:
1. A method of manufacturing a light emitting device, the method comprising:
   providing a first intermediate body including
      a substrate,
      a plurality of first bonding members,
      a second bonding member,
      a light emitting element mounted on an upper surface of the substrate via the plurality of first bonding members,
      a protecting element mounted on the upper surface of the substrate via the second bonding member and spaced apart from the light emitting element,
      a light transmissive member bonded to an upper surface of the light emitting element, and
      a light-shielding frame surrounding the light transmissive member in a top view, a portion of an outer periphery of the light-shielding frame being located above the protecting element such that at least a portion of the protecting element is exposed from the light-shielding frame in the top view;
   disposing a first resin between the light emitting element and the substrate by applying the first resin on the substrate in a region outside of the portion of the protecting element exposed from the light-shielding frame in the top view such that the first resin moves toward the light emitting element along the protecting element; and
   curing the first resin to obtain a first cover member.
2. The method of manufacturing a light emitting device according to claim 1, wherein
   the disposing of the first resin includes applying the first resin such that the first resin comes into contact with an upper surface of the protecting element.
3. The method of manufacturing a light emitting device according to claim 1, further comprising
   after the disposing of the first resin, forming a second cover member on the substrate, the second cover member covering the first cover member and lateral surfaces of the light-shielding frame.
4. The method of manufacturing a light emitting device according to claim 1, wherein
   the providing of the first intermediate body includes
      providing a second intermediate body, the second intermediate body including the light transmissive member including a first surface, a second surface opposite to the first surface, and lateral surfaces between the first surface and the second surface, the light-shielding frame having an inner surface defining an opening, and a third cover member bonding the inner surface of the light-shielding frame and the lateral surfaces of the light transmissive member.

5. The method of manufacturing a light emitting device according to claim 4, wherein the providing of the first intermediate body includes bonding the second surface of the light transmissive member in the second intermediate body and the upper surface of the light emitting element.

6. The method of manufacturing a light emitting device according to claim 1, wherein the providing of the first intermediate body includes providing the first intermediate body including an additional light emitting element with the light emitting element and the additional light emitting element being aligned along a first direction, and the disposing of the first resin includes applying the first resin along the first direction.

7. The method of manufacturing a light emitting device according to claim 1, wherein the providing of the first intermediate body includes providing the first intermediate body including the light transmissive member containing a phosphor.

8. The method of manufacturing a light emitting device according to claim 1, wherein the providing of the first intermediate body includes providing the first intermediate body including the light transmissive member including a first surface serving as a light emission surface of the light emitting device, a second surface opposite to the first surface, and lateral surfaces disposed between the first surface and the second surface with the first surface having an area dimension smaller than an area dimension of the second surface.

9. The method of manufacturing a light emitting device according to claim 1, wherein the providing of the first intermediate body includes providing the first intermediate body including the light-shielding frame having a thickness in a range of 20 μm to 200 μm.

10. The method of manufacturing a light emitting device according to claim 1, wherein the disposing of the first resin includes applying the first resin having a viscosity in a range of 0.5 Pa·s to 30 Pa·s.

* * * * *